United States Patent
Kim et al.

(10) Patent No.: US 10,396,258 B2
(45) Date of Patent: Aug. 27, 2019

(54) LIGHT EMITTING DEVICE PACKAGE

(71) Applicant: LG INNOTEK CO., LTD., Seoul (KR)

(72) Inventors: Dae Geun Kim, Seoul (KR); Kyoung Un Kim, Seoul (KR); Seul Ki Kim, Seoul (KR); Bong Kul Min, Seoul (KR); Gyu Hyeong Bak, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 380 days.

(21) Appl. No.: 15/314,118

(22) PCT Filed: May 13, 2015

(86) PCT No.: PCT/KR2015/004777
§ 371 (c)(1),
(2) Date: Nov. 28, 2016

(87) PCT Pub. No.: WO2015/182899
PCT Pub. Date: Dec. 3, 2015

(65) Prior Publication Data
US 2017/0200874 A1    Jul. 13, 2017

(30) Foreign Application Priority Data
May 30, 2014    (KR) .................. 10-2014-0066271

(51) Int. Cl.
*H01L 33/00*    (2010.01)
*H01L 27/15*    (2006.01)
(Continued)

(52) U.S. Cl.
CPC .......... *H01L 33/62* (2013.01); *H01L 25/0753* (2013.01); *H01L 33/486* (2013.01);
(Continued)

(58) Field of Classification Search
CPC ... H01L 25/0753; H01L 33/486; H01L 33/64; H01L 25/075; H01L 27/15; H01L 33/08; H01L 31/12; H01L 33/20
(Continued)

(56) References Cited

U.S. PATENT DOCUMENTS 9,024,334 B2 * 5/2015 Agatani .................... F21K 9/00
257/100
2011/0116252 A1  5/2011 Agatani et al.
(Continued)

FOREIGN PATENT DOCUMENTS

CN    103915540    7/2014
EP    2 211 082    7/2010
(Continued)

OTHER PUBLICATIONS

International Search Report (with English Translation) and Written Opinion dated Jul. 28, 2015 issued in Application No. PCT/KR2015/004777.
(Continued)

*Primary Examiner* — Kimberly N Rizkallah
*Assistant Examiner* — Dilinh P Nguyen
(74) *Attorney, Agent, or Firm* — Ked & Associates LLP

(57) ABSTRACT

An embodiment comprises: a substrate having a chip mounting region; first and second wiring layers disposed on the substrate around the chip mounting region so as to be spaced apart from each other; and a plurality of light emitting chips disposed on the chip mounting region, wherein the first wiring layer comprises a first wiring pattern disposed at one side of a reference line and having a first concave part, and a first extending pattern extending from the first wiring pattern to the other side of the reference line, the second wiring layer comprises a second wiring pattern disposed at the other side of the reference line and having a second
(Continued)

concave part, and a second extending pattern extending from the second wiring pattern to one side of the reference line, and the reference line is a straight line passing through the center of the chip mounting region.

15 Claims, 9 Drawing Sheets

(51) Int. Cl.
  *H01L 33/62* (2010.01)
  *H01L 25/075* (2006.01)
  *H01L 33/48* (2010.01)
  *H01L 33/64* (2010.01)

(52) U.S. Cl.
  CPC .... *H01L 33/64* (2013.01); *H01L 2224/48091* (2013.01); *H01L 2924/181* (2013.01)

(58) Field of Classification Search
  USPC .......................................... 257/88, 79, 82, 95
  See application file for complete search history.

(56) References Cited

U.S. PATENT DOCUMENTS

| | | | |
|---|---|---|---|
| 2012/0049223 | A1 | 3/2012 | Yang et al. |
| 2014/0084311 | A1 | 3/2014 | Takeda et al. |
| 2014/0103797 | A1 | 4/2014 | Ishizaki et al. |

FOREIGN PATENT DOCUMENTS

| | | |
|---|---|---|
| JP | 2011-061077 | 3/2011 |
| JP | 2012-015467 | 1/2012 |
| JP | 2012-169392 | 9/2012 |
| JP | 2012-230967 | 11/2012 |
| JP | 2014-067816 | 4/2014 |
| KR | 10-2013-008737 | 8/2013 |
| KR | 10-2013-0087374 | 8/2013 |
| TW | 201220535 | 5/2012 |

OTHER PUBLICATIONS

European Search Report dated Mar. 23, 2017 issued in Application No. 15800384.8.
Chinese Office Action dated Apr. 16, 2018 issued in Application No. 2015800287358 (with English translation).

\* cited by examiner

LIGHT EMITTING DEVICE PACKAGE

CROSS-REFERENCE TO RELATED PATENT APPLICATIONS

This application is a U.S. National Stage Application under 35 U.S.C. § 371 of PCT Application No. PCT/KR2015/004777, filed May 13, 2015, which claims priority to Korean Patent Application No. 10-2014-0066271, filed May 30, 2014, whose entire disclosures are hereby incorporated by reference.

TECHNICAL FIELD

Embodiments relate to a light-emitting device package.

BACKGROUND ART

Light-emitting devices, such as Light Emitting Diodes (LEDs) or Laser Diodes (LDs), which use Group III-V or II-VI compound semiconductors, are capable of emitting ultraviolet light and visible light in various colors, such as red, green, and blue, owing to thin film growth techniques and the development of element materials, and are also capable of emitting white light with high luminous efficacy by using a fluorescent substance or by combining colors.

Also, light-emitting devices have several advantages, including low power consumption, a semi-permanent lifespan, a fast response speed, good safety, and environmental friendliness, compared to conventional light sources such as fluorescent lamps and incandescent lamps. Accordingly, the fields of application of such light-emitting devices have expanded to encompass transmission modules of optical communication units, light-emitting diode backlights to replace Cold Cathode Fluorescence Lamps (CCFLs), which serve as backlights of Liquid Crystal Displays (LCDs), white light-emitting diode lighting devices to replace fluorescent lamps or incandescent lamps, vehicle headlights, and traffic lights.

The light-emitting device package, which has a structure such that a light-emitting device is mounted to a package body in an electrical connection manner, is primarily used as a light source of a display apparatus. Specifically, a Chip-on-Board (COB) light-emitting device package has a structure such that light-emitting devices, for example, LED chips, are directly die-bonded to the substrate in an electrical connection manner using wire bonding, and is primarily configured as a light-emitting device array in which a plurality of light-emitting devices are arranged on the substrate.

DISCLOSURE

Technical Problem

Embodiments provide a light-emitting device package capable of mitigating limitations on the length of a wire in a wire-bonding process and of improving the freedom in the arrangement of light-emitting chips in a chip-mounting region.

Technical Solution

In one embodiment, a light-emitting device package includes a substrate having a chip-mounting region, first and second wiring layers disposed on the substrate around the chip-mounting region so as to be spaced apart from each other, and a plurality of light-emitting chips disposed on the chip-mounting region, wherein the first wiring layer includes a first wiring pattern disposed at one region with respect to a reference line and having a first concave portion, and a first extension pattern extending from the first wiring pattern to an opposite region with respect to the reference line, the second wiring layer includes a second wiring pattern disposed at the opposite region with respect to the reference line and having a second concave portion, and a second extension pattern extending from the second wiring pattern to the one region with respect to the reference line, and the reference line is a straight line passing through a center of the chip-mounting region.

The second concave portion may be concave in a direction opposite the first concave portion.

The first extension pattern may extend from one end of an inner peripheral surface of the first concave portion, a distal end of the first extension pattern may be spaced apart from a remaining end of the inner peripheral surface of the first concave portion, the second extension pattern may extend from one end of an inner peripheral surface of the second concave portion, and a distal end of the second extension pattern may be spaced apart from a remaining end of the inner peripheral surface of the second concave portion.

The first concave portion and the second concave portion may have a semi-spherical shape, an elliptical shape, or a polygonal shape, and the first extension pattern and the second extension pattern may have a shape of a curved line.

The first extension pattern may include a first connection portion connected to one end of the first concave portion, and a first extension portion connected to the first connection portion and having a shape of a curved line that is concave in a direction opposite the first concave portion, and the second extension pattern may include a second connection portion connected to one end of the second concave portion, and a second extension portion connected to the second connection portion and having a shape of a curved line that is concave in a direction opposite the second concave portion. The first connection portion may be disposed between a remaining end of the second concave portion and a distal end of the second extension pattern, and the second connection portion may be disposed between a remaining end of the first concave portion and a distal end of the first extension pattern.

The first connection portion and the second connection portion may face each other in a direction parallel to the reference line.

The first connection portion and the first extension portion may have the same width, and the second connection portion and the second extension portion may have the same width.

A first opening may be formed between a remaining end of the first concave portion and a distal end of the first extension portion, a second opening may be formed between a remaining end of the second concave portion and a distal end of the second extension portion, the first connection portion may pass through the second opening, and the second connection portion may pass through the first opening. The first opening and the second opening may be aligned with the reference line.

The first wiring layer and the second wiring layer may be origin-symmetric to each other about the center of the chip-mounting region.

The first extension portion may be disposed along an inner peripheral surface of the second concave portion so as to be spaced a predetermined distance apart from the inner peripheral surface of the second concave portion, and the second extension portion may be disposed along an inner peripheral surface of the concave portion so as to be spaced a predetermined distance apart from the inner peripheral surface of the first concave portion.

The distance between the first extension portion and the inner peripheral surface of the second concave portion may be the same as the distance between the second extension portion and the inner peripheral surface of the first concave portion.

The substrate may include a first substrate, and a second substrate including the first wiring layer and the second wiring layer and disposed on the first substrate so as to expose a portion of the first substrate corresponding to the chip-mounting region.

The light-emitting device package may further include a first bonding layer disposed on the first wiring pattern and the first extension pattern, and a second bonding layer disposed on the second wiring pattern and the second extension pattern.

The light-emitting device package may further include a protective layer disposed on the first and second wiring layers so as to expose the first and second bonding layers. The light-emitting device package may further include at least one first wire for connecting the first bonding layer and at least one of the light-emitting chips, and at least one second wire for connecting the second bonding layer and at least one of the light-emitting chips.

The light-emitting device package may further include a partition wall portion disposed on the first bonding layer and the second bonding layer so as to cover one ends of the first and second wires.

The light-emitting device package may further include a molding portion filling in a recess portion in the second substrate and an interior of the partition wall portion so as to envelop the light-emitting chips and the first and second wires.

The first bonding layer may be disposed on a region of a top surface of the first wiring pattern, located within a predetermined distance from the first concave portion, and on a top surface of the first extension pattern, and may be in contact with the first concave portion, and the second bonding layer may be disposed on a region of a top surface of the second wiring pattern, located within a predetermined distance from the second concave portion, and on a top surface of the second extension pattern, and may be in contact with the second concave portion.

Alternatively, the first bonding layer may include first bonding portions disposed on the first wiring pattern and the first extension pattern so as to be spaced apart from one another and to be in contact with the first concave portion, and the second bonding layer may include second bonding portions disposed on the second wiring pattern and the second extension pattern so as to be spaced apart from one another and to be in contact with the second concave portion.

In another embodiment, a light-emitting device package includes a substrate having a chip-mounting region, a first wiring layer including a first wiring pattern disposed at one region on the substrate with respect to a reference line and having a first concave portion that is concave in a first direction, and a second extension pattern having a first extension portion extending from an inner peripheral surface between one end and a remaining end of the first concave portion in a second direction, a second wiring layer including a second wiring pattern disposed at an opposite region on the substrate with respect to the reference line and having a second concave portion that is concave in the second direction, and a second extension pattern including a second extension portion extending from one end of the second wiring pattern to the one region with respect to the reference line and a third extension portion extending from a remaining end of the second wiring pattern to the one region with respect to the reference line, and a plurality of light-emitting chips disposed on the chip-mounting region, wherein the first extension pattern passes through a space between a distal end of the second extension portion and a distal end of the third extension portion, the reference line is a straight line passing through a center of the chip-mounting region, and the first direction and the second direction are opposite each other.

The first extension portion may have a ring shape so as to surround the chip-mounting region.

The light-emitting device package may further include a first bonding layer disposed on the first extension portion, and a second bonding layer disposed on a region of a top surface of the second wiring pattern, located within a predetermined distance from the second concave portion, and on the second extension pattern.

Alternatively, the light-emitting device package may further include first bonding portions disposed on the first extension pattern so as to be spaced apart from one another, and second bonding portions disposed on a region of a top surface of the second wiring pattern, located within a predetermined distance from the second concave portion, and on the second extension pattern so as to be spaced apart from one another.

The light-emitting device package may further include wires for connecting the first and second bonding layers and the light-emitting chips, and a partition wall portion disposed on the first bonding layer and the second bonding layer so as to cover one ends of the wires, connected to the first and second bonding layers.

In a further embodiment, a lighting device includes a light source module including the light-emitting device package according to the embodiment, and a radiator for radiating heat of the light source module.

Advantageous Effects

Embodiments are capable of mitigating limitations on the length of a wire in a wire-bonding process and of improving the freedom in the arrangement of light-emitting chips in a chip-mounting region.

BEST MODE

Figure 1:
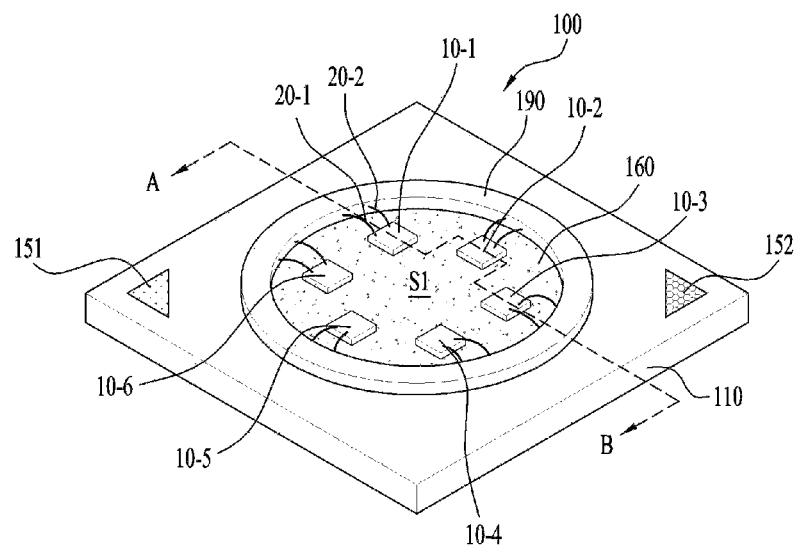
FIG. 1 illustrates a perspective view of a light-emitting device package according to an embodiment.

Hereinafter, embodiments will be clearly understood from the annexed drawings and the description associated with the embodiments. In the description of the embodiments, it will be understood that when an element, such as a layer (film), a region, a pattern or a structure, is referred to as being "on" or "under" another element, such as a layer (film), a region, a pad or a pattern, the term "on" or "under" means that the element is directly on or under the other element or intervening elements may also be present. It will also be understood that "on" or "under" is determined based on the drawings.

In the drawings, elements may be exaggerated in size, omitted or schematically illustrated for convenience in description and clarity. Further, the sizes of elements do not indicate the actual sizes of the elements. Wherever possible, the same reference numbers will be used throughout the drawings to refer to the same parts.

Figure 2:
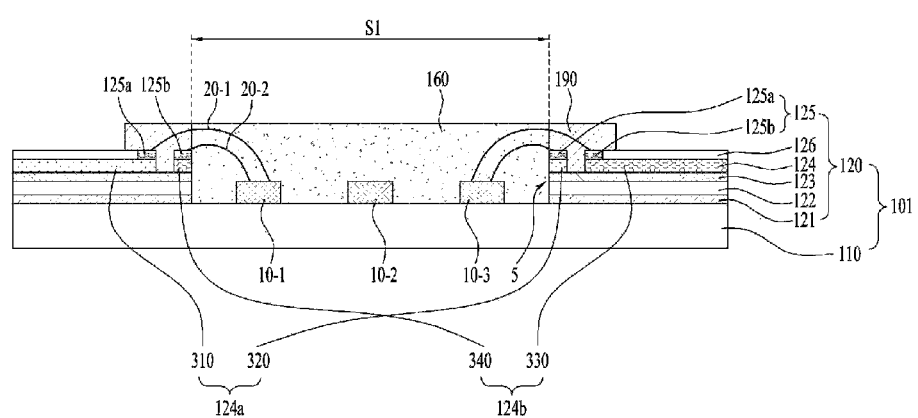
FIG. 2 illustrates a sectional view taken along direction AB of the light-emitting device package depicted in FIG. 1.

FIG. 1 illustrates a perspective view of a light-emitting device package 100 according to an embodiment, and FIG. 2 illustrates a sectional view taken along direction AB of the light-emitting device package 100 depicted in FIG. 1.

Referring to FIGS. 1 and 2, the light-emitting device package 100 comprises a substrate 101, light-emitting chips 10-1 to 10-6, a partition wall portion (or a dam) 190, and a molding portion 160.

The substrate 101 may include a plurality of layers 110 and 120. A plurality of layers 110 and 120 may be vertically stacked. The light-emitting chips 10-1 to 10-6 are disposed on the substrate 101, and a portion of the substrate 101 for deployment of the light-emitting chips 10-1 to 10-6 will be referred to as a "chip-mounting region S1".

For example, the substrate 101 may include a first substrate 110 and a second substrate 120 disposed on the first substrate 110.

The first substrate 110 may be a substrate having a first thermal conductivity, the second substrate 120 may be a substrate having a second thermal conductivity, and the first thermal conductivity may be higher than the second thermal conductivity. This serves to quickly discharge heat, generated from the light-emitting chips 10-1 to 10-6, to the outside through the first substrate 110, which has high thermal conductivity.

The first substrate 110 may serve as a heat dissipation plate having high light reflectivity and high thermal conductivity, and may be a metal substrate made of any one material selected from the group consisting of, for example, copper (Cu), aluminum (Al), silver (Ag), gold (Au) and an alloy thereof and may be formed in a single-layer structure or a multiple-layer structure. For example, the first substrate 110 may be a Metal Cored Printed Circuit Board (MCPCB).

The second substrate 120 may be a substrate, for example, a Printed Circuit Board (PCB), which includes a wiring layer 125 connected electrically to the light-emitting chips 10-1 to 10-6.

The second substrate 120 may have a through-hole 5, which corresponds to the chip-mounting region S1 and through which the first substrate 110 is exposed. The through-hole 5 in the second substrate 120 may expose the chip-mounting region S1 of the first substrate 110.

For example, as shown in FIG. 1, the chip-mounting region S1 may be located in the center portion of the second substrate 120, and may have a circular shape, an elliptical shape, or a polygonal shape; however, the embodiment is not limited thereto, and various other shapes may be applied.

A plurality of light-emitting chips 10-1 to 10-6 is disposed on the chip-mounting region S1 of the substrate 101. Although six light-emitting chips are illustrated in FIG. 1, the embodiment is not limited thereto, and the number of light-emitting chips may be two or more.

For example, a plurality of light-emitting chips 10-1 to 10-6 may be disposed on the portion of the top surface of the first substrate 110 that is exposed by the through-hole 5 in the second substrate 120, for example, in the chip-mounting region S1.

The second substrate 120 may have a stacked structure comprising multiple layers. For example, the second substrate 120 may include a wiring layer 124, a bonding layer 125, and a protective layer 126. The second substrate 120 may additionally include a first adhesive layer 121, an insulating layer 122, and a second adhesive layer 123.

The insulating layer 122 may be disposed between the first substrate 110 and the wiring layer 124, and may electrically insulate the first substrate 110 and the wiring layer 124 from each other.

In one instance, the insulating layer 122 may be formed to include a polymer material having excellent heat resistance, for example, epoxy-based, polyimide-based, or polyamide-based resin or rubber, oxide, or nitride.

The first adhesive layer 121 may be disposed between the first substrate 110 and the insulating layer 122, and may attach the insulating layer 122 to the first substrate 110.

The first adhesive layer 121 may be made of a material having electrical conductivity and adhesion, for example, a material selected from the group consisting of lead (Pb), gold (Au), tin (Sn), indium (In), silver (Ag), nickel (Ni), niobium (Nb), copper (Cu) and an alloy thereof.

Further, in another embodiment, the first adhesive layer 121 may also be made of a material having electrically insulating, transparent and adhesive properties, for example, a material selected from the group consisting of polyimide (PI), benzocyclobutene (BCB) and perfluorocyclobutene (PFOB).

The wiring layer 124 is disposed on the insulating layer 122. The wiring layer 124 is a part having a circuit pattern, which may be formed of a conductive material, for example, copper (Cu), aluminum (Al), or silver (Ag). The second adhesive layer 123 may be disposed between the insulating layer 122 and the wiring layer 124, and may attach the wiring layer 124 to the insulating layer 122. The second adhesive layer 123 may be formed of the same material as the material of the first adhesive layer 121. In another embodiment, at least one of the first adhesive layer 121 and the second adhesive layer 123 may be omitted.

The wiring layer 124 may include a first wiring layer 124a and a second wiring layer 124b, which are arranged on the insulating layer 122 so as to be electrically separated from each other.

Figure 3:
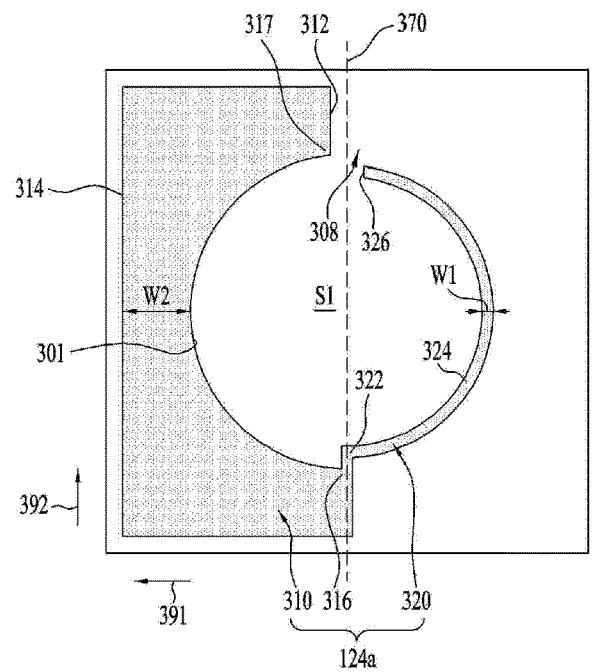
FIG. 3 illustrates a plan view of a first wiring layer according to the embodiment.

FIG. 3 illustrates a plan view of the first wiring layer 124a according to the embodiment.

Referring to FIG. 3, the first wiring layer 124a may include a first wiring pattern 310 having a first concave portion 301, and a first extension pattern 320 extending from one end 316 of the first concave portion 301.

The first wiring pattern 310 and the first extension pattern 320 may be located opposite each other with respect to a reference line 370. For example, the reference line 370 may be a line that passes through the central point of the top surface of the first substrate 110 and is perpendicular to each of a pair of opposite sides facing each other of the top surface of the first substrate 110. For example, the reference line 370 may be an imaginary straight line that passes through the center 501 (see FIG. 5) of the chip-mounting region S1 and divides the chip-mounting region into two sections or in half, and the chip-mounting region may be bilaterally symmetrical with respect to the reference line 370.

For example, the first wiring pattern 310 may be located on the left with respect to the reference line 370, and the first extension pattern 320 may be located on the right with respect to the reference line 370.

The first concave portion 301 may be formed in a first side surface 312 of the first wiring pattern 310, and may be concave in the direction 391 toward a second side surface 314 of the first wiring pattern 310 from the first side surface 312 (hereinafter, referred to as a "first direction"). The second side surface 314 and the first side surface 312 may be side surfaces that face each other.

For example, the first concave portion 301 in the first wiring pattern 310 may be located on the left with respect to the reference line 370 and may have a planar shape that is concave in the first direction 391.

The shape of the first concave portion 301 may be a semi-spherical shape, a semi-elliptical shape, or a polygonal shape, but is not limited thereto.

The first extension pattern 320 may extend from one end 316 of the inner peripheral surface of the first concave portion 301, and the distal end 326 of the first extension pattern 320 may be spaced apart from the other end 317 of the inner peripheral surface of the first concave portion 301. The first extension pattern 320 may extend in a direction parallel to the top surface of the first wiring pattern 310.

For example, one end 316 of the inner peripheral surface of the first concave portion 301 may be a region of the first concave portion 301 that is contiguous with the first side surface 312 of the first wiring pattern 310, and the other end 317 of the inner peripheral surface of the first concave portion 301 may be another region of the first concave portion 301 that is contiguous with the first side surface 312 of the first wiring pattern 310.

The first extension pattern 320 may have the shape of a curved line, and the first extension pattern 320 may have a first width W1 smaller than or equal to a second width W2 of the first wiring pattern 310.

For example, the first width W1 of the first extension pattern 320 and the second width W2 of the first wiring pattern 310 may be 0.2 mm to 2 mm. When the first width W1 of the first extension pattern 320 and the second width W2 of the first wiring pattern 310 are less than 0.2 mm, it is difficult to perform a wire-bonding process. That is, the first width W1 of the first extension pattern 320 and the second width W2 of the first wiring pattern 310 may be 0.2 mm or more in consideration of the size of a wire ball and the wire capillary margin. For example, the ratio (W1:W2) of the first width W1 of the first extension pattern 320 to the second width W2 of the first wiring pattern 310 may range from 1:1 to 1:10.

When the first width W1 of the first extension pattern 320 and the second width W2 of the first wiring pattern 310 exceed 2 mm, the freedom in the design of the first wiring layer 124a may be reduced. There is also a need to increase the size of the partition wall portion 190 when the first width W1 of the first extension pattern 320 exceeds 2 mm.

For example, the second width W2 of the first wiring pattern 310 may be a minimum distance between the first concave portion 301 and the second side surface 314 of the first wiring pattern 310.

At least a portion of the first extension pattern 320 may be disposed on the right with respect to the reference line 370.

For example, the first extension pattern 320 may include a first connection portion 322, which is connected to one end 316 of the inner peripheral surface of the first concave portion 301, and a first extension portion 324, which is connected to the first connection portion 322.

For example, the first connection portion 322 may extend from one end 316 of the inner peripheral surface of the first concave portion 301 in a second direction 392, and may have a straight line shape; however, the embodiment is not limited thereto. The second direction 392 may be perpendicular to the first direction 391. The first connection portion 322 may be located on the left with respect to the reference line 370, or at least a portion of the first connection portion 322 may overlap the reference line 370 or may be aligned therewith.

The first extension portion 324 may be connected to the distal end of the first connection portion 322, may have a curved line shape that is concave in the direction opposite the first concave portion 301, and may be disposed on the right with respect to the reference line 370.

The width of the first extension portion 324 and the width of the first connection portion 322 may be the same; however, the embodiment is not limited thereto.

Although the first extension pattern 320 having a semi-circular ring shape is illustrated in FIGS. 1 to 3, the embodiment is not limited thereto, and, in another embodiment, the first extension pattern 320 may have at least one of a bent line shape and a curved line shape, which is bent or curved once or more so as to be concave in the direction opposite the first direction 391.

The distal end 326 of the first extension pattern 320 may be located adjacent to the other end 317 of the inner peripheral surface of the first concave portion 301, and the distal end 326 of the first extension pattern 320 and the other end 317 of the inner peripheral surface of the first concave portion 301 may be spaced apart from each other. For example, a first passage or a first opening 308 may be formed between the other end 317 of the first concave portion 301 and the distal end of the first extension portion 320. For example, at least a portion of the first opening 308 may overlap the reference line 370 or may be aligned therewith.

Figure 4:
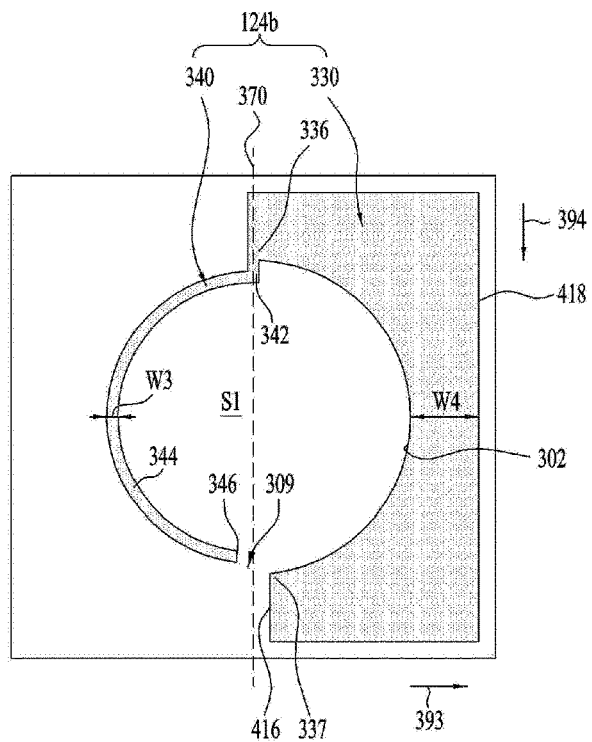
FIG. 4 illustrates a plan view of a second wiring layer according to the embodiment.

FIG. 4 illustrates a plan view of the second wiring layer 124b according to the embodiment.

Referring to FIG. 4, the second wiring layer 124b may include a second wiring pattern 330 having a second concave portion 302, and a second extension pattern 340 extending from one end 336 of the second concave portion 302.

The second wiring pattern 330 and the second extension pattern 340 may be located opposite each other with respect to the reference line 370.

For example, the second wiring pattern 330 may be located on the right with respect to the reference line 370, and the second extension pattern 340 may be located on the left with respect to the reference line 370.

Also, the second wiring pattern 330 and the first wiring pattern 310 may be located opposite each other with respect to the reference line 370, and the second extension pattern 340 and the first extension pattern 320 may be located opposite each other with respect to the reference line 370.

The second concave portion 302 may be formed on a first side surface 416 of the second wiring pattern 330, and may be concave in the direction 393 toward a second side surface 418 of the second wiring pattern 330 from the first side surface 416 (hereinafter, referred to as a "third direction"). The second side surface 418 and the first side surface 416 may be side surfaces that face each other, and the third direction 318 may be opposite the first direction.

For example, the second concave portion 302 of the second wiring pattern 330 may be located on the right with respect to the reference line 370 and may have a planar shape that is concave in the direction 393 opposite the first concave portion 301.

The shape of the second concave portion 302 may be a semi-spherical shape, a semi-elliptical shape, or a polygonal shape, but is not limited thereto. For example, the shape of the second concave portion 302 may be a semi-spherical shape, a semi-elliptical shape, or a polygonal shape, but is not limited thereto.

The second extension pattern 340 may extend from one end 336 of the inner peripheral surface of the second concave portion 302, and the distal end 346 of the second extension pattern 340 may be spaced apart from the other end 337 of the inner peripheral surface of the second concave portion 302. The second extension pattern 340 may extend in a direction parallel to the top surface of the second wiring pattern 330.

For example, one end 336 of the inner peripheral surface of the second concave portion 302 may be a region of the second concave portion 302 that is contiguous with the first side surface 416 of the second wiring pattern 330, and the other end 337 of the inner peripheral surface of the second concave portion 302 may be another region of the second concave portion 302 that is contiguous with the first side surface 416 of the second wiring pattern 330.

The second extension pattern 340 may have a curved line shape, and the second extension pattern 340 may have a first width W3 smaller than or equal to a second width W4 of the second wiring pattern 330. For example, the second width W4 of the second wiring pattern 330 may be a minimum distance between the second concave portion 302 and the second side surface 418 of the second wiring pattern 330.

For example, the first width W3 of the second extension pattern 340 and the second width W4 of the second wiring pattern 330 may be 0.2 mm to 2 mm.

When the first width W3 of the second extension pattern 340 and the second width W4 of the second wiring pattern 330 are less than 0.2 mm, it is difficult to perform a wire-bonding process. That is, the first width W3 of the second extension pattern 340 and the second width W4 of the second wiring pattern 330 may be 0.2 mm or more in consideration of the size of a wire ball and the wire capillary margin. For example, the ratio (W3:W4) of the first width W3 of the second extension pattern 340 to the second width W4 of the second wiring pattern 330 may range from 1:1 to 1:10.

When the first width W3 of the second extension pattern 340 and the second width W4 of the second wiring pattern 330 exceed 2 mm, the freedom in the design of the second wiring layer 124b may be reduced. There is also a need to increase the size of the partition wall portion 190 when the first width W3 of the second extension pattern 240 exceeds 2 mm.

At least a portion of the second extension pattern 340 may be disposed on the left with respect to the reference line 370.

For example, the second extension pattern 340 may include a second connection portion 342, which is connected to one end 336 of the inner peripheral surface of the second concave portion 302, and a second extension portion 344, which is connected to the second connection portion 342.

For example, the second connection portion 342 may extend from one end 336 of the inner peripheral surface of the second concave portion 302 in a fourth direction 394, and may have a straight line shape; however, the embodiment is not limited thereto. The fourth direction 394 may be opposite the second direction 392. The second connection portion 342 may be located on the right with respect to the reference line 370, or at least a portion of the second connection portion 342 may overlap the reference line 370 or may be aligned therewith.

The second extension portion 344 may be connected to the distal end of the second connection portion 342, may have a curved line shape that is concave in the direction opposite the second concave portion 302, and may be disposed on the left with respect to the reference line 370.

The width of the second extension portion 344 and the width of the second connection portion 342 may be the same; however, the embodiment is not limited thereto.

Although the second extension pattern 340 is illustrated as having a semi-circular ring shape in FIGS. 1 to 3, the embodiment is not limited thereto, and, in another embodiment, the second extension pattern 340 may have at least one of a bent line shape and a curved line shape, which is bent or curved once or more so as to be concave in the direction opposite the third direction 393.

The distal end 346 of the second extension pattern 340 may be located adjacent to the other end 337 of the inner peripheral surface of the second concave portion 302, and the distal end 346 of the second extension pattern 340 and the other end 337 of the inner peripheral surface of the second concave portion 302 may be spaced apart from each other. For example, a second passage or a second opening 309 may be formed between the other end 337 of the second concave portion 302 and the distal end of the second extension portion 344. For example, at least a portion of the second opening 309 may overlap the reference line 370 or may be aligned therewith.

Figure 5:
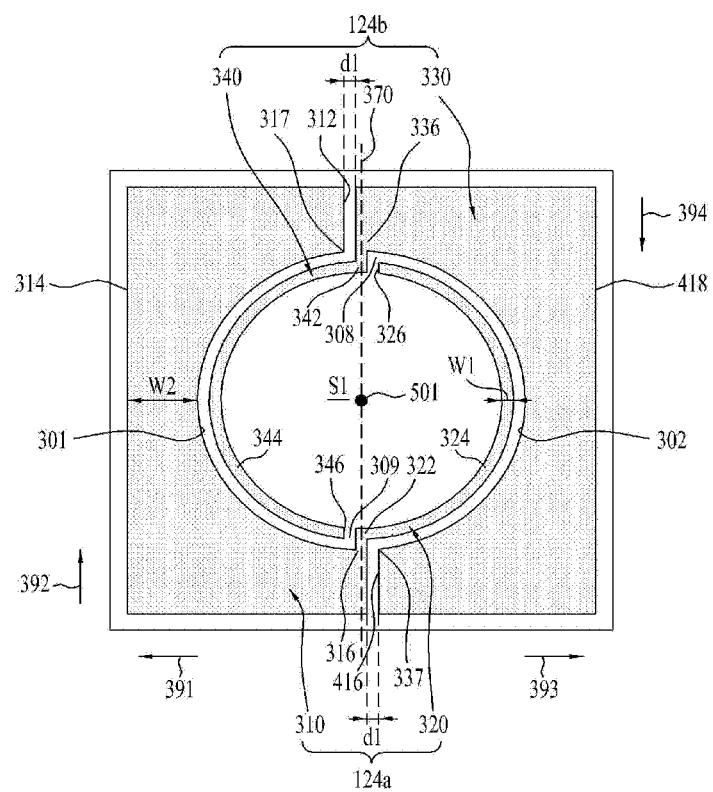
FIG. 5 illustrates the arrangement of the first wiring layer and the second wiring layer.

FIG. 5 illustrates the arrangement of the first wiring layer 124a and the second wiring layer 124b.

Referring to FIG. 5, the first wiring layer 124a and the second wiring layer 124b may be spaced apart from each other such that the first concave portion 301 and the second concave portion 302 face each other. For example, the first wiring layer 124a and the second wiring layer 124b may be spaced apart from each other such that the first concave portion 301 and the second concave portion 302 are concave in mutually opposite directions.

Also, the first side surface 312 of the first wiring pattern 310 and the first side surface 416 of the second wiring pattern 330 may be arranged adjacent to each other so as to face each other, or may be spaced apart from each other.

The distance d1 between the first wiring layer 124a and the second wiring layer 124b may be 150 μm or more. When the distance d1 between the first wiring layer 124a and the second wiring layer 124b is less than 150 μm, there may be the risk of a short circuit, and it may be difficult to dissipate the heat generated by the flow of electric current.

The ratio (W1/d1) of the first width W1 of the first extension pattern 320 to the distance d1 between the first wiring layer 124*a* and the second wiring layer 124*b* may range from 1:1 to 40/3.

The ratio (W3/d1) of the first width W3 of the second extension pattern 340 to the distance d1 between the first wiring layer 124*a* and the second wiring layer 124*b* may range from 1:1 to 40/3.

The first extension pattern 320 may be disposed so as to pass through the first opening 308, and the second extension pattern 340 may be disposed so as to pass through the second opening 309.

For example, the first connection portion 322 may pass through the first opening 308, and the second connection portion 342 may pass through the second opening 309.

The first connection portion 322 may be spaced apart from the other end 337 of the inner peripheral surface of the second concave portion 302 and the distal end 346 of the second extension pattern 340.

Also, the second connection portion 342 may be spaced apart from the other end 317 of the inner peripheral surface of the first concave portion 301 and the distal end 326 of the first extension pattern 320.

The first connection portion 322 may be connected to one end 316 of the inner peripheral surface of the first concave portion 301 and may be disposed between the other end 337 of the inner peripheral surface of the second concave portion 302 and the distal end 346 of the second extension pattern 340.

The first extension portion 324 may be connected to the distal end of the first connection portion 322 and may be arranged along the inner peripheral surface of the second concave portion 302 while being spaced a predetermined distance apart from the inner peripheral surface of the second concave portion 302. The first extension portion 324 may have the same shape, for example, a semi-circular shape, a semi-elliptical shape or a polygonal shape, as the inner peripheral surface of the second concave portion 302; however, the embodiment is not limited thereto.

For example, the distance between the first extension portion 324 and the second concave portion 302 may be the same as the distance d1 between the first side surface 312 of the first wiring pattern 310 and the first side surface 416 of the second wiring pattern 330; however, the embodiment is not limited thereto.

The distal end of the first extension pattern 320, that is, the distal end of the first extension portion 324, may be disposed adjacent to or apart from the second connection portion 342.

The second connection portion 342 may be connected to one end 336 of the inner peripheral surface of the second concave portion 302, and may be disposed between the other end 317 of the inner peripheral surface of the first concave portion 301 and the distal end 326 of the first extension pattern 320.

One end 316 of the inner peripheral surface of the first concave portion 301, to which the first connection portion 322 is connected, and one end 336 of the inner peripheral surface of the second concave portion 302, to which the second connection portion 342 is connected, may be located opposite each other, and the first connection portion 322 and the second connection portion 342 may be arranged so as to face each other in the direction parallel to the reference line 370.

The second extension portion 344 may be connected to the distal end of the second connection portion 342 and may be arranged along the inner peripheral surface of the first concave portion 301 while being spaced a predetermined distance apart from the inner peripheral surface of the first concave portion 301. The second extension portion 344 may have the same shape, for example, a semi-circular shape, a semi-elliptical shape or a polygonal shape, as the inner peripheral surface of the first concave portion 301; however, the embodiment is not limited thereto.

For example, the distance between the second extension portion 344 and the first concave portion 301 may be the same as the distance d1 between the first side surface 312 of the first wiring pattern 310 and the first side surface 416 of the second wiring pattern 330; however, the embodiment is not limited thereto.

Further, for example, the distance between the first extension portion 324 and the second concave portion 302 may be the same as the distance between the second extension portion 344 and the first concave portion 301; however, the embodiment is not limited thereto.

The distal end of the second extension pattern 340, that is, the distal end of the second extension portion 344, may be disposed adjacent to or apart from the first connection portion 322.

The overall shape that the first concave portion 301 and the second concave portion 302 form together may be a circular shape, an elliptical shape or a polygonal shape; however, the embodiment is not limited thereto.

The first extension pattern 320 and the second extension pattern 340 may be arranged so as to surround the chip-mounting region S1, and the overall shape that the first extension portion 324 and the second extension portion 344 form together may be a circular shape, an elliptical shape or a polygonal shape; however, the embodiment is not limited thereto.

For example, the first wiring layer 124*a* and the second wiring layer 124*b* may be origin-symmetric to each other about the center 501 of the chip-mounting region S1.

The bonding layer 125 is disposed on the wiring layer 124, and ends of the wires for electrical connection with the light-emitting chips 10-1 to 10-6 are bonded to the bonding layer 125. For example, the bonding layer 125 may include at least one of gold (Au) and nickel (Ni), or may include an alloy of gold (Au) and nickel (Ni).

Figure 6A:
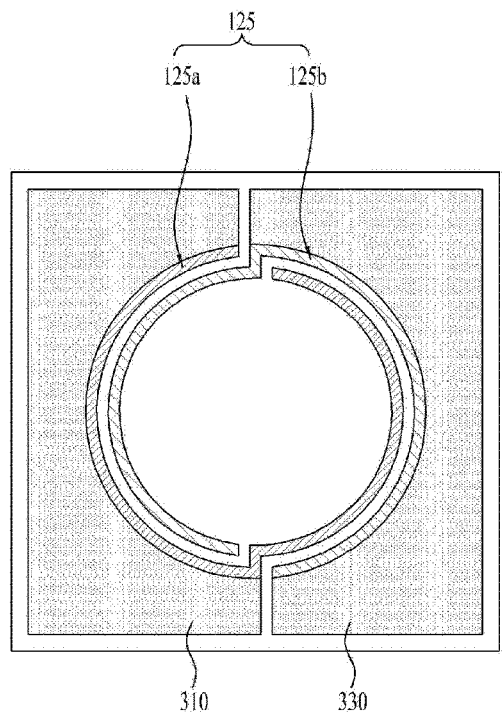
FIG. 6A illustrates one embodiment of a bonding layer disposed on the wiring layer.

FIG. 6A illustrates one embodiment of the bonding layer disposed on the wiring layer 124.

Referring to FIG. 6A, the bonding layer 125 may be disposed on a first region of the first wiring pattern 310, which is adjacent to the first concave portion 301, on the first extension pattern 320, on a first region of the second wiring pattern 330, which is adjacent to the second concave portion 302, and on the second extension pattern 340.

For example, the bonding layer 125 may include a first bonding layer 125*a*, which is disposed on the first region of the first wiring pattern 310 and on the top surface of the first extension pattern 320, and a second bonding layer 125*b*, which is disposed on the first region of the second wiring pattern 330 and on the top surface of the second extension pattern 340.

At this time, the first region of the first wiring pattern 310 may be a region of the top surface of the first wiring pattern 310 that is located within a predetermined distance from the first concave portion 301, and the first region of the second wiring pattern 330 may be a region of the top surface of the second wiring pattern 330 that is located within a predetermined distance from the second concave portion 302.

The first bonding layer 125*a*, which is located on the first region of the first wiring pattern 310, may be in contact with the first concave portion 301, and the second bonding layer 125*b*, which is located on the first region of the second wiring pattern 330, may be in contact with the second concave portion 302.

The first bonding layer 125*a*, which is located on the first region of the first wiring pattern 310, may have a shape corresponding to the shape of the first concave portion 301, for example, a semi-circular shape or a semi-elliptical shape; however, the embodiment is not limited thereto. Also, the second bonding layer 125*b*, which is located on the first region of the second wiring pattern 330, may have a shape corresponding to the shape of the second concave portion 302, for example, a semi-circular shape or a semi-elliptical shape; however, the embodiment is not limited thereto.

For example, a first portion of the first bonding layer 125*a*, which is formed in the first region of the first wiring pattern 310, may have the same width as a second portion of the first bonding layer 125*a*, which is formed on the first extension pattern 320; however, the embodiment is not limited thereto. Also, a first portion of the second bonding layer 125*b*, which is formed in the first region of the second wiring pattern 330, may have the same width as a second portion of the second bonding layer 125*b*, which is formed on the second extension pattern 340; however, the embodiment is not limited thereto.

Figure 6B:
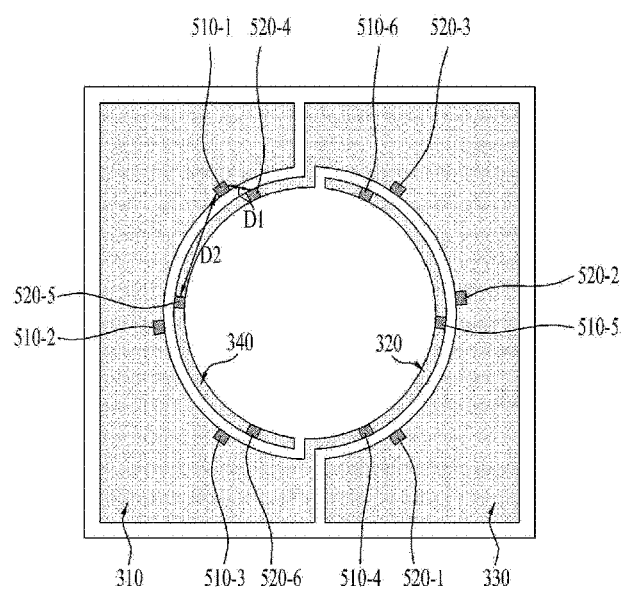
FIG. 6B illustrates another embodiment of a bonding layer disposed on the wiring layer.

FIG. 6B illustrates another embodiment of the bonding layer disposed on the wiring layer 124.

Referring to FIG. 6B, the bonding layer 125 may include a plurality of bonding portions 510-1 to 510-6 and 520-1 to 520-6 disposed on the wiring layer 124.

The bonding layer 125 may include first bonding portions 510-1 to 510-6, which are disposed on the first wiring pattern 310 and the first extension pattern 320 and are spaced apart from one another, and second bonding portions 520-1 to 520-6, which are disposed on the second wiring pattern 330 and the second extension pattern 340 and are spaced apart from one another.

The first bonding portions 510-1 to 510-6 may be disposed on the top surface of the first wiring pattern 310, which is adjacent to the first concave portion 301, and the first extension pattern 320 while being spaced apart from one another. For example, the first bonding portions 510-1, 510-2 and 510-3, which are disposed on the first wiring pattern 310, may be in contact with the first concave portion 301.

The second bonding portions 520-1 to 520-6 may be disposed on the top surface of the second wiring pattern 330, which is adjacent to the second concave portion 302, and the second extension pattern 340 while being spaced apart from one another. For example, the second bonding portions 520-1, 520-2 and 520-3, which are disposed on the second wiring pattern 313, may be in contact with the second concave portion 301.

The first and second bonding portions 510-1 to 510-6 and 520-1 to 520-6 may be grouped into groups, and each of the groups may include one first bonding portion and one second bonding portion. The first and second bonding portions 510-1 to 510-6 and 520-1 to 520-6 may be grouped into groups such that the distance between one first bonding portion and one second bonding portion is minimized. This is for the purpose of facilitating wire bonding between the light-emitting devices 10-1 to 10-6, which will be described later, and the first and second bonding portions in each group.

The first distance D1 between the first bonding portion (for example, 510-1) and the second bonding portion (for example, 520-4), which are included in each of the groups, may be shorter than the second distance D2 between two adjacent groups. For example, the second distance D2 may be a minimum distance between the first bonding portion or the second bonding portion, which belongs to one of the two adjacent groups, and the first bonding portion or the second bonding portion, which belongs to the other group.

Since the bonding layer depicted in FIG. 6A is formed on the first region of the first wiring pattern 310, the first extension pattern 320, the first region of the second wiring pattern 330 and the second extension pattern 340, the freedom in the arrangement of the light-emitting chips 10-1 to 10-6 may be improved. This is for the purpose of facilitating wire bonding between the first bonding layer and the second bonding layer regardless of the position in the chip-mounting region S1 at which the light-emitting chips 10-1 to 10-6 are disposed.

Meanwhile, since the bonding layer depicted in FIG. 6B is formed on a portion of the first region of the first wiring pattern 310, a portion of the first extension pattern 320, a portion of the first region of the second wiring pattern 330 and a portion of the second extension pattern 340, the freedom in the arrangement of the light-emitting chips 10-1 to 10-6 may be relatively deteriorated compared to FIG. 6*a*, but the material cost for formation of the bonding layer may be reduced.

In another embodiment, the bonding layer may be disposed on the entire area of the top surface of the wiring layer. For example, the bonding layer may be disposed on the entire area of the top surface of the first wiring pattern 310, on the first extension pattern 320, on the entire area of the top surface of the second wiring pattern 330, and on the second extension pattern 340.

The protective layer 126 may be disposed on the wiring layer 124, and may expose the bonding layer 125 to perform wire bonding.

Figure 7A:
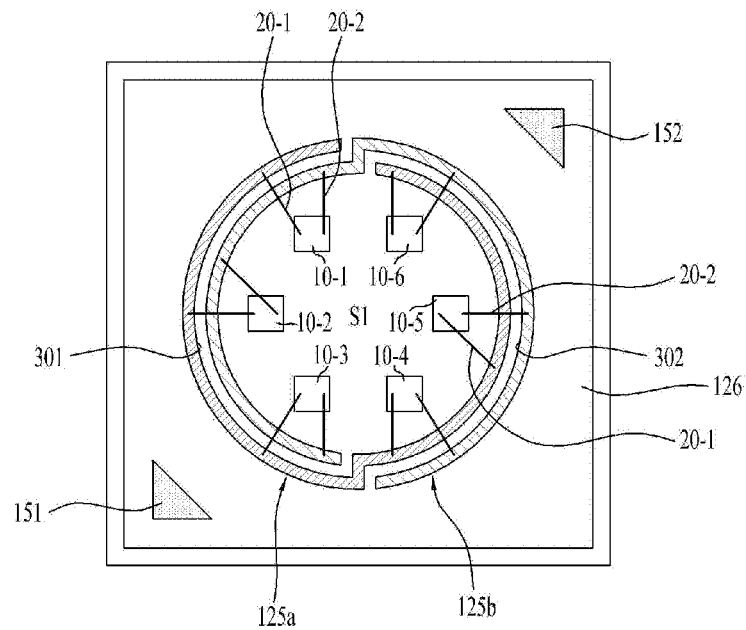
FIGS. 7A and 7B illustrate a protective layer 126 disposed on the wiring layer.
Figure 7B:
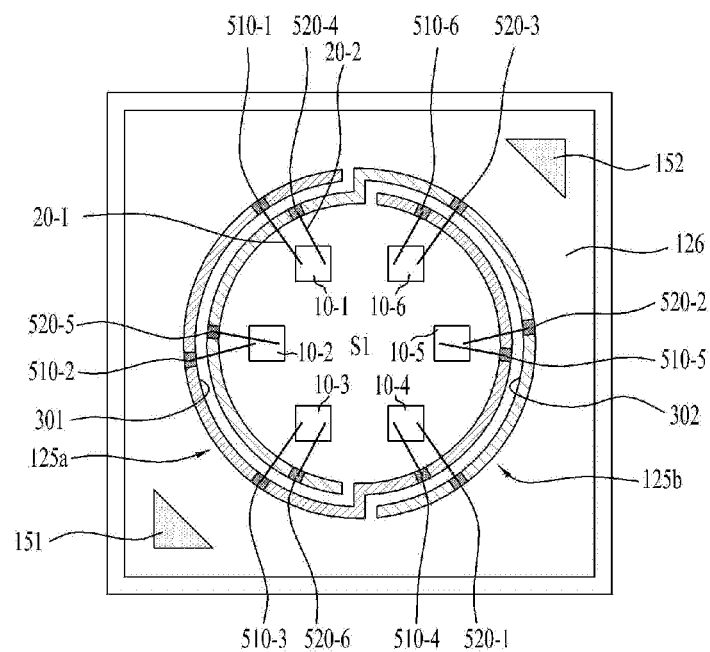

FIGS. 7A and 7B illustrate the protective layer 126 disposed on the wiring layer.

Referring to FIGS. 7A and 7B, the protective layer 126 may expose a second region 151 of the first wiring pattern 310 and a second region 152 of the second wiring pattern 330.

The second region 151 may be another region of the top surface of the first wiring pattern 310, which is spaced apart from the first region of the first wiring pattern 310, the second region 152 may be another region of the top surface of the second wiring pattern 330, which is spaced apart from the first region of the second wiring pattern 330, and the shape of each of the second regions may be a circular shape, a polygonal shape (for example, a triangular shape) or an elliptical shape, but is not limited thereto. In another embodiment, the protective layer 126 may not expose the second region 151 of the first wiring pattern 310 and the second region 152 of the second wiring pattern 330.

The second region 151 of the first wiring pattern 310 may be disposed adjacent to a corner that is contiguous with the second side surface 314 of the first wiring pattern 310, and the second region 152 of the second wiring pattern 330 may be disposed adjacent to a corner that is contiguous with the second side surface 418 of the second wiring pattern 330; however, the embodiment is not limited thereto.

The second region 151 of the first wiring pattern 310 and the second region 152 of the second wiring pattern 330 may be exposed for the purpose of electrical connection such as wire bonding.

The protective layer 126 may be disposed on the region of the first wiring pattern 310 other than the first region and the second region 151 of the first wiring pattern 310, and on the region of the second wiring pattern 330 other than the first region and the second region 152 of the second wiring pattern 330.

The first bonding layer 125a and the second bonding layer 125b in FIG. 7A may be exposed through the protective layer 126, and the first and second bonding portions 510-1 to 510-6 and 520-1 to 520-6 in FIG. 7B may be exposed through the protective layer 126. In FIG. 7B, a portion of the first region of the first wiring pattern 310, a portion of the first extension pattern 320, a portion of the first region of the second wiring pattern 330 and a portion of the second extension pattern 340, other than the regions occupied by the first and second bonding portions 510-1 to 510-6 and 520-1 to 520-6, may be exposed through the protective layer 126.

A portion of the protective layer 126 may also be disposed between the first side surface 312 of the first wiring pattern 310 and the first side surface 416 of the second wiring pattern 330.

The protective layer 126 may be in contact with a portion of the first bonding layer 125a that is disposed on the first region of the first wiring pattern 310, and may be in contact with a portion of the second bonding layer 125b that is disposed on the first region of the second wiring pattern 330.

The protective layer 126 may prevent the wiring layer 124 from being oxidized. In addition, the protective layer 126 may reflect light. For example, the protective layer 126 may include a reflective insulation material having superior heat resistance and discoloration resistance, for example, a white solder resist.

The light-emitting chips 10-1 to 10-6 may be disposed on the portion of the first substrate 110, which corresponds to the chip-mounting region S1 exposed by the through-hole 5, while being spaced apart from one another. For example, the light-emitting chips 10-1 to 10-6 may be respective light-emitting diodes.

The respective light-emitting chips 10-1 to 10-6 may be electrically connected to the bonding layer 125 by wires 20-1 and 20-2.

At least one of the wires 20-1 and 20-2 may electrically connect at least one of the light-emitting chips 10-1 to 10-6 and the first and second bonding layers 125a and 125b.

Referring to FIG. 7A, each of the light-emitting chips 10-1 to 10-6 may be electrically connected to the first bonding layer 125A by the first wire 20-1 and may be electrically connected to the second bonding layer 125b by the second wire 20-2.

In general, when a plurality of light-emitting chips is electrically connected to the first wiring layer and the second wiring layer, which are arranged at different positions on the substrate so as to be electrically separated from each other, the distance between the light-emitting chips and the first and second wiring layers may vary depending on the positions at which the light-emitting chips are arranged. The electrical connection between the light-emitting chips and the first and second wiring layers may be achieved by wire bonding. There may be limitations on the length of a wire in a wire-bonding process, which leads to limitations on the distances between the first and second wiring layers and the light-emitting chips and limitations on series and parallel connection among the light-emitting chips.

Particularly, as the number of light-emitting chips that are mounted is increased, limitations on series and parallel connection among the light-emitting chips may be increased and wire bonding among the light-emitting chips may become impossible.

Since the first wiring pattern 310 and the second wiring pattern 330 are located opposite each other with respect to the reference line 370, and since the first extension pattern 320 and the second extension pattern 340 are located opposite each other with respect to the reference line 370 so as to surround the chip-mounting region S1, the wire bonding between the first and second wiring layers 124a and 124b and the light-emitting chips 10-1 to 10-6 may be facilitated regardless of the position in the chip-mounting region S1 at which the light-emitting chips 10-1 to 10-6 are disposed.

That is, the embodiment is capable of mitigating limitations on the length of a wire in a wire-bonding process and consequently of improving the freedom in the arrangement of the light-emitting chips 10-1 to 10-6 in the chip-mounting region S1.

Referring to FIG. 7B, each of the light-emitting chips 10-1 to 10-6 may be electrically connected to a corresponding one of the first bonding portions 510-1 to 510-6 by the first wire 20-1, and may be electrically connected to a corresponding one of the second bonding portions 520-1 to 520-6 by the second wire 20-2.

Although FIGS. 7A and 7B illustrate light-emitting chips 10-1 to 10-6 that are connected in parallel to the first and second wiring layers 124a and 124b, the embodiment is not limited thereto. In another embodiment, the light-emitting chips may be connected in series. In a further embodiment, the light-emitting chips may be connected in series-parallel.

The partition wall portion 190 is disposed on the bonding layer 125.

Figure 8:
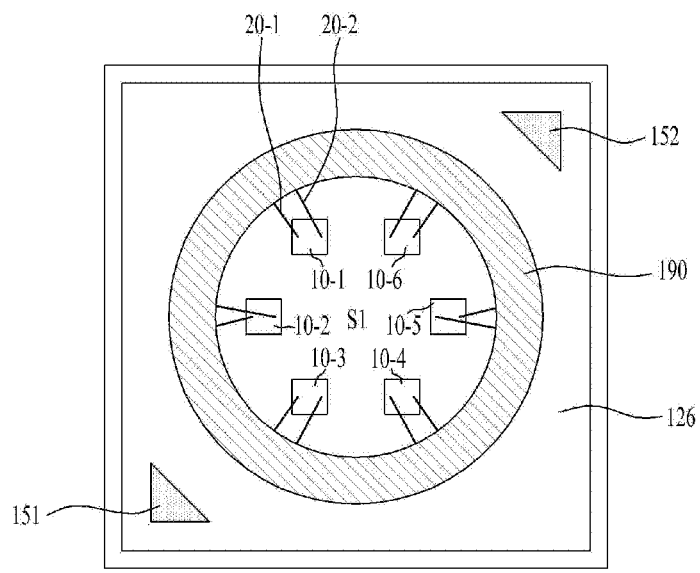
FIG. 8 illustrates a plan view of a partition wall portion depicted in FIG. 1.

FIG. 8 illustrates a plan view of the partition wall portion 190 depicted in FIG. 1.

In the case of FIG. 7A, the partition wall portion 190 may be disposed on the first bonding layer 125a and the second bonding layer 125b.

Also, in the case of FIG. 7B, the partition wall portion 190 may be disposed on the first and second bonding portions 510-1 to 510-6 and 520-1 to 520-6, and on a portion of the first regions of the first and second wiring patterns 310 and 330 and a portion of the first and second extension patterns 320 and 340 other than the regions occupied by the first and second bonding portions 510-1 to 510-6 and 520-1 to 520-6.

Also, in FIGS. 7A and 7B, the partition wall portion 190 may be partially further disposed on a portion of the top surface of the protective layer 126 that is adjacent to the first and second bonding layers, between the first concave portion 301 and the second extension pattern 340, between the second concave portion 302 and the first extension pattern 320, and between the first bonding layer 125a and the second bonding layer 125b.

As shown in FIG. 8, the shape of the partition wall portion 190 may be a ring shape, but is not limited thereto.

The partition wall portion 190 may be in contact with the bonding layer 125, the first and second concave portions 310 and 302 and the second adhesive layer 123. The partition wall portion 190 may cover the ends of the first wires 20-1 and the ends of the second wires 20-2, which are electrically connected to the bonding portion 124.

The partition wall portion 190 may prevent the bonding layer 125 from being oxidized, and may protect the ends of the first and second wires 20-1 and 20-2 from external shocks. Further, the partition wall portion 190 may serve to guide a molding material in the formation of the molding portion 160.

The partition wall portion 190 may be formed of a light-transmitting insulation material, for example, transparent silicon. In another embodiment, the partition wall portion 190 may be formed of a reflective insulation material, for example, white silicon.

In order to prevent the molding material from permeating the protective layer 126 when forming the molding portion 160, the height of the top surface of the partition wall portion 190 from the top surface of the first substrate 110 may be higher than the height of the top surface of the protective layer 126.

The molding portion 160 fills in the recess portion of the substrate 101 in order to envelop or seal the light-emitting chips 10-1 to 10-6 and the first and second wires 20-1 and 20-2.

For example, the molding portion 160 may fill in the through-hole 50 in the second substrate 120 and the interior of the partition wall portion 190 in order to envelop the light-emitting chips 10-1 to 10-6 and the first and second wires 20-1 and 20-2.

The molding portion 160 may serve to protect the light-emitting chips 10-1 to 10-6 and the wires 20-1 and 20-2 from external shocks and oxidization.

As shown in FIGS. 1 and 2, the top surface of the molding portion 160 may be a flat surface, which is parallel to the top surface of the partition wall portion 190 and is located in the same plane as the top surface of the partition wall portion 190; however, the embodiment is not limited thereto. In another embodiment, the top surface of the molding portion 160 may be lower or higher than the top surface of the partition wall portion 190 and may be a curved surface.

The molding portion 160 may be resin or rubber that includes a colorless and transparent polymer material, for example, epoxy or silicon.

The molding portion 160 may convert the wavelength of the light emitted from the light-emitting chips 10-1 to 10-6. For example, the molding portion 160 may include a mixture of a polymer material and a phosphor. Here, the phosphor may include at least one of a red phosphor, a yellow phosphor and a green phosphor.

Because there are limitations on the length of a wire in a wire-bonding process for a light-emitting device package including a plurality of light-emitting chips, the freedom in the arrangement of the light-emitting chips may be deteriorated. However, depending on the embodiment, the first extension pattern 320 and the second extension pattern 340 may be arranged symmetrically to each other around the chip-mounting region S1 and may be disposed opposite each other with respect to the reference line 370, thereby mitigating limitations on the length of a wire in a wire-bonding process and improving the freedom in the arrangement of the light-emitting chips 10-1 to 10-6 in the chip-mounting region S1.

Figure 9:
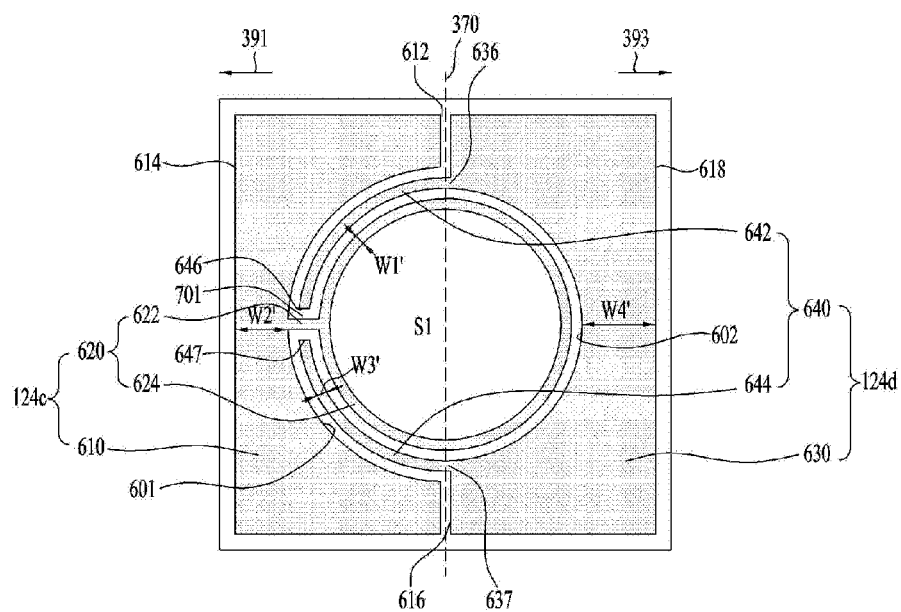
FIG. 9 illustrates a first wiring layer and a second wiring layer according to another embodiment.

FIG. 9 illustrates a first wiring layer 124c and a second wiring layer 124d according to another embodiment.

Referring to FIG. 9, the first wiring layer 124c may include a first wiring pattern 610 having a first concave portion 601, and a first extension pattern 620 extending from the first concave portion 601.

The first concave portion 601 may be formed on a first side surface 612 of the first wiring pattern 610, and may be concave in the direction 391 (the first direction) that is directed toward a second side surface 614 of the first wiring pattern 610 from the first side surface 612. The second side surface 614 and the first side surface 612 may be side surfaces that face each other.

For example, the first concave portion 601 of the first wiring pattern 610 may be located on the left with respect to the reference line 370 and may have a planar shape that is concave in the first direction 391. The shape of the first concave portion 601 may be a semi-spherical shape, a semi-elliptical shape, or a polygonal shape, but is not limited thereto.

The first extension pattern 620 may extend from the inner peripheral surface of the first concave portion 601 between one end and the other end of the first concave portion 601, and may include a ring shape. The first extension pattern 620 may extend in a direction parallel to the top surface of the first wiring pattern 610.

For example, the first extension pattern 620 may extend from the middle portion of the inner peripheral surface of the first concave portion 601 in the direction opposite the first direction 391.

For example, the first extension pattern 620 may include a first connection portion 622 connected to the middle portion of the inner peripheral surface of the first concave portion 601, and a first extension portion 624 connected to the first connection portion 622.

For example, the first connection portion 622 may extend from the middle portion of the inner peripheral surface of the first concave portion 601 in the direction opposite the first direction, and may have a straight line shape, but is not limited thereto. The first connection portion 622 may be located on the left with respect to the reference line 370.

The first extension pattern 620 may have a first width W1' smaller than or equal to a second width W2' of the first wiring pattern 610. For example, the second width W2' of the first wiring pattern 610 may be a minimum distance between the first concave portion 601 and the second side surface 614 of the first wiring pattern 610.

For example, the first width W1' of the first extension pattern 620 and the second width W2' of the first wiring pattern 610 may be 0.2 mm to 2 mm. When the first width W1' of the first extension pattern 620 and the second width W2' of the first wiring pattern 610 are less than 0.2 mm, it is difficult to perform a wire-bonding process. That is, the first width W1' of the first extension pattern 620 and the second width W2' of the first wiring pattern 610 may be 0.2 mm or more in consideration of the size of a wire ball and the wire capillary margin. For example, the ratio (W1':W2') of the first width W1' of the first extension pattern 620 to the second width W2' of the first wiring pattern 610 may range from 1:1 to 1:10.

When the first width W1' of the first extension pattern 620 and the second width W2' of the first wiring pattern 610 exceed 2 mm, the freedom in the design of the first wiring layer 124c may be reduced, and there is also a need to increase the size of the partition wall portion 190.

The first extension portion 624 may be connected to the distal end of the first connection portion 622, may have a circular, elliptical or polygonal ring shape, and may be disposed so as to surround the chip-mounting region. The chip-mounting region S1 may be located within the first extension portion 624.

The width of the first extension portion 624 and the width of the first connection portion 622 may be the same; however, the embodiment is not limited thereto. The diameter of the inner peripheral surface of the first extension portion 624 may be smaller than the diameter of the first concave portion 601.

The second wiring layer 124d may include a second wiring pattern 630 having a second concave portion 602, and a second extension pattern 640 extending from one end 636 and the other end 637 of the second concave portion 602.

The second wiring pattern 630 and the second extension pattern 640 may be located opposite each other with respect to the reference line 370.

For example, the second wiring pattern 630 and the first wiring pattern 610 may be located opposite each other with respect to the reference line 370. The second wiring pattern 630 may be located on the right with respect to the reference line 370, and the second extension pattern 640 may be located on the left with respect to the reference line 370.

The second concave portion 602 may be formed on a first side surface 616 of the second wiring pattern 630, and may be concave in a direction 393 that is directed toward a second side surface 618 of the second wiring pattern 630 from the first side surface 616. The second side surface 618 and the first side surface 616 may be side surfaces that face each other, and the third direction 393 may be opposite the first direction 391.

For example, the second concave portion 602 of the second wiring pattern 630 may be located on the right with respect to the reference line 370 and may have a planar shape that is concave in the third direction 393.

The shape of the second concave portion 602 may be a semi-spherical shape, a semi-elliptical shape, or a polygonal shape, but is not limited thereto. For example, the shape of the second concave portion 602 may be a semi-spherical shape, a semi-elliptical shape, or a polygonal shape, but is not limited thereto.

The second extension pattern 640 may have a semi-spherical ring shape having an opening 701, one end 636 of the second extension pattern 640 may be in contact with one end 636 of the second wiring pattern 630 that is in contact with the second concave portion 602, and the other end of the second extension pattern 640 may be in contact with the other end 637 of the second wiring pattern 630 that is in contact with the second concave portion 602.

The second extension pattern 640 may be spaced apart from the first connection portion 622. For example, the first connection portion 622 of the first extension pattern 620 may be disposed so as to pass through the opening 701.

The second extension pattern 640 may include a second extension portion 642, which extends from one end 636 of the second wiring pattern 630 that is in contact with the second concave portion 602, and a third extension portion 644, which extends from the other end 637 of the second wiring pattern 630 that is in contact with the second concave portion 602. The second extension pattern 640 may extend in a direction parallel to the top surface of the second wiring pattern 620.

The distal end of the second extension portion 642 and the distal end of the third extension portion 644 may be spaced apart from each other, and the first extension pattern 622 may pass through the space between the distal end of the second extension portion 642 and the distal end of the third extension portion 644.

For example, the first connection portion 622 of the first extension pattern 622 may be located in the space between the distal end of the second extension portion 642 and the distal end of the third extension portion 644, and the first extension portion 624 may have a ring shape so as to surround the chip-mounting region S1.

The second extension portion 642 may be disposed between a portion of the first concave portion 601 and the first extension portion 624, and the third extension portion 644 may be disposed between another portion of the first concave portion 601 and the first extension portion 624.

The second extension pattern 640 may have a first width W3' smaller than or equal to a second width W4' of the second wiring pattern 630. For example, the second width W4' of the second wiring pattern 630 may be a minimum distance between the second concave portion 602 and the second side surface 618 of the second wiring pattern 630.

The width of the second extension portion 642 may be the same as the width of the third extension portion 644; however, the embodiment is not limited thereto.

For example, the first width W3' of the second extension pattern 640 and the second width W4' of the second wiring pattern 630 may be 0.2 mm to 2 mm. When the first width W3' of the second extension pattern 640 and the second width W4' of the second wiring pattern 630 are less than 0.2 mm, it is difficult to perform a wire-bonding process. That is, the first width W3' of the second extension pattern 640 and the second width W4' of the second wiring pattern 630 may be 0.2 mm or more in consideration of the size of a wire ball and the wire capillary margin. For example, the ratio (W3':W4') of the first width W3' of the second extension pattern 640 to the second width W4' of the second wiring pattern 630 may range from 1:1 to 1:10.

When the first width W3' of the second extension pattern 640 and the second width W4' of the second wiring pattern 630 exceed 2 mm, the freedom in the design of the second wiring layer 124d may be reduced, and there is also a need to increase the size of the partition wall portion 190.

At least a portion of the second extension pattern 640 may be disposed on the left with respect to the reference line 370.

The first wiring layer 124c and the second wiring layer 124d may be spaced apart from each other such that the first concave portion 601 and the second concave portion 602 face each other. Also, the first side surface 612 of the first wiring pattern 610 and the first side surface 616 of the second wiring pattern 630 may be arranged adjacent to each other so as to face each other, or may be spaced apart from each other.

The overall shape that the second concave portion 602 and the second extension pattern 640 form together may be a circular shape, an elliptical shape or a polygonal shape, and may have an opening 701 therein. Also, the first extension pattern 620, for example, the first extension portion 624, may be disposed so as to surround the chip-mounting region S1.

The distance between the first wiring layer 124c and the second wiring layer 124d may be the same as the distance between the first wiring layer 124a and the second wiring layer 124b, which was described with reference to FIG. 5.

A bonding layer 125-1 is disposed on the first wiring layer 124c and the second wiring layer 124d, and ends of the wires for electrical connection with the light-emitting chips 10-1 to 10-6 are bonded to the bonding layer.

Figure 10A:
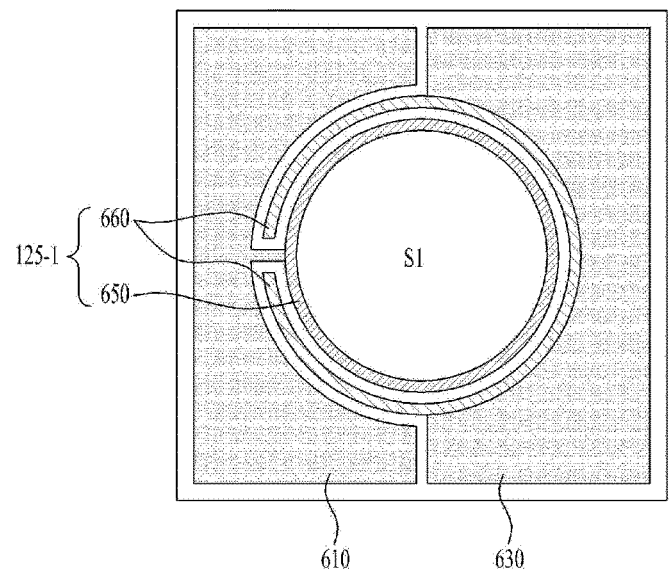
FIG. 10A illustrates one embodiment of a bonding layer disposed on the first and second wiring layers.

FIG. 10A illustrates one embodiment of the bonding layer 125-1 disposed on the first and second wiring layers 124c and 124d.

Referring to FIG. 10A, the bonding layer 125-1 may be disposed on the first extension pattern 620, the first region of the second wiring pattern 630 that is adjacent to the second concave portion 602, and the second extension pattern 640.

The bonding layer 125-1 may include a first bonding layer 650 disposed on the first extension pattern 620, and a second bonding layer 660 disposed on the first region of the second wiring pattern 630 and the second extension pattern 640. At this time, the first region of the second wiring pattern 630 may be a region of the top surface of the second wiring pattern 630 that is located within a predetermined distance from the second concave portion 602. The second bonding layer 660, which is located on the first region of the second wiring pattern 630, may have a shape corresponding to the shape of the second concave portion 602, for example, a semi-circular shape or a semi-elliptical shape; however, the embodiment is not limited thereto.

For example, the first bonding layer 650 may not be disposed on the first connection portion 622 of the first extension pattern 620, and may be disposed only on the first extension portion 624.

Figure 10B:
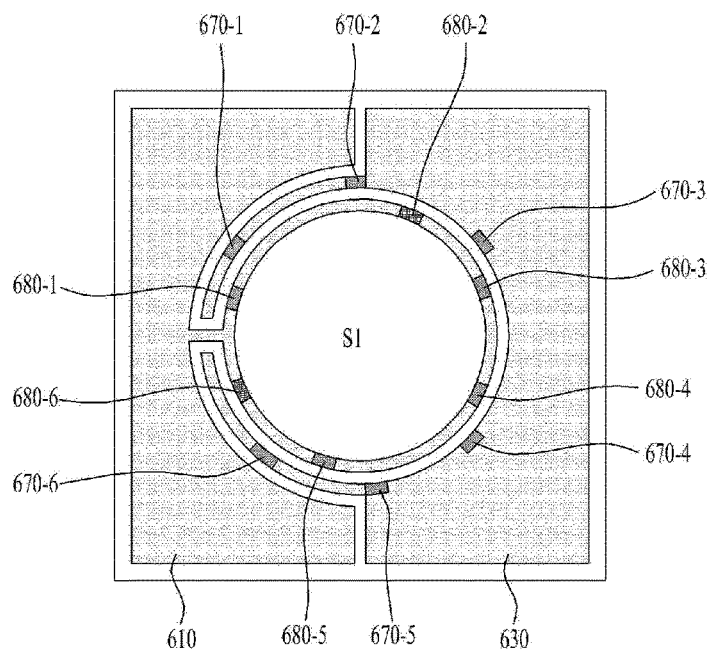
FIG. 10B illustrates another embodiment of a bonding layer disposed on the first and second wiring layers.

FIG. 10B illustrates another embodiment of the bonding layer disposed on the first and second wiring layers 124c and 124d.

The bonding layer illustrated in FIG. 10B may include a plurality of bonding portions 680-1 to 680-6 and 670-1 to 670-6 disposed on the first and second wiring layers 124c and 124d.

The bonding layer illustrated in FIG. 10B may include first bonding portions 680-1 to 680-6 disposed on the first extension pattern 620, and second bonding portions 670-1 to 670-6 disposed on the second wiring pattern 630 and the second extension pattern 640.

The first bonding portions 680-1 to 680-6 may be disposed on the first extension pattern 620 while being spaced apart from one another.

The second bonding portions 670-1 to 670-6 may be disposed on the first region of the second wiring pattern 630 and the second extension pattern 640 while being spaced apart from one another.

The first and second bonding portions 680-1 to 680-6 and 670-1 to 670-6 may be grouped into groups, and each of the groups may include one first bonding portion and one second bonding portion. The explanation of the grouping and arrangement of the first bonding portions 510-1 to 510-6 and the second bonding portions 520-1 and 520-6, which was made with reference to FIG. 7B, may be identically applied to FIG. 10B.

For the same reason as described with reference to FIGS. 6A and 6B, the embodiment illustrated in FIG. 10A may improve the freedom in the arrangement of the light-emitting chips, and the embodiment illustrated in FIG. 10B may reduce the material cost for formation of the bonding layer.

A protective layer 126-1 may be disposed on the first and second wiring layers 124c and 124d and may expose the bonding layer 125-1 to perform wire bonding.

Figure 11A:
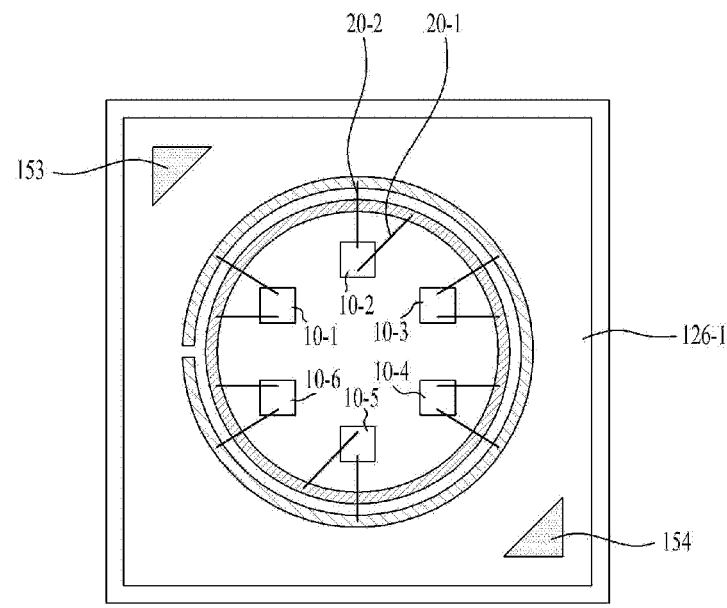
FIGS. 11A and 11B illustrate a protective layer disposed on the first and second wiring layers.
Figure 11B:
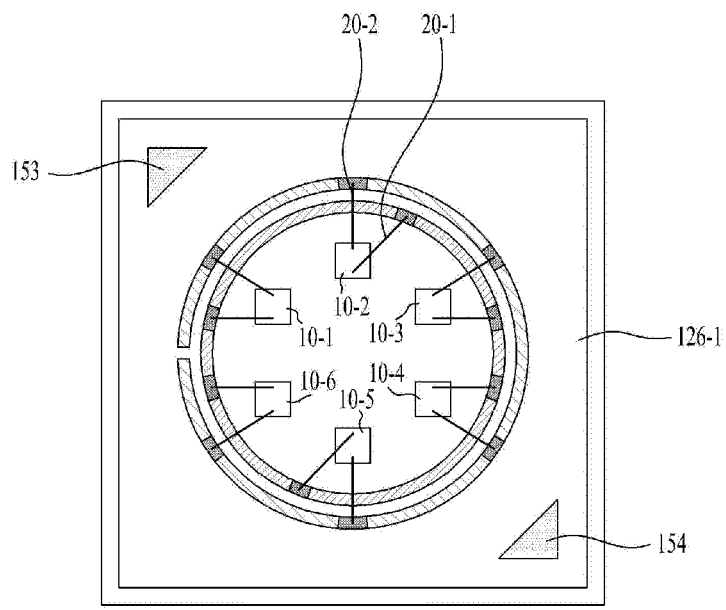

FIGS. 11A and 11B illustrate the protective layer 126-1 disposed on the first and second wiring layers 124c and 124d.

Referring to FIGS. 11A and 11B, the protective layer 126-1 may expose the second region 153 of the first wiring pattern 610 and the second region 154 of the second wiring pattern 630. The second region 153 of the first wiring pattern 610 and the second region 154 of the second wiring pattern 630 may be the same as the second region 151 of the first wiring pattern 310 and the second region 152 of the second wiring pattern 330, which were described with reference to FIGS. 7A and 7B.

The protective layer 126-1 may be disposed on the region of the first wiring pattern 610 other than the second region 153 of the first wiring pattern 610 and on the region of the second wiring pattern 630 other than the first region and the second region 154 of the second wiring pattern 630.

For example, a portion of the protective layer 126-1 may be disposed on the first connection portion 622 of the first extension pattern 620.

The first bonding layer 650 and the second bonding layer 660 in FIG. 10A may be exposed through the protective layer 126-1, and the first and second bonding portions 670-1 to 670-6 and 680-1 to 680-6 in FIG. 10B may be exposed through the protective layer 126-1. In FIG. 10B, a portion of the first extension pattern 620, a portion of the first region of the second wiring pattern 630 and a portion of the second extension pattern 640, other than the regions occupied by the first and second bonding portions 670-1 to 670-6 and 680-1 to 680-6, may be exposed through the protective layer 126-1.

A portion of the protective layer 126-1 may also be disposed between the first side surface 612 of the first wiring pattern 610 and the first side surface 616 of the second wiring pattern 630.

The protective layer 126-1 may be in contact with a portion of the second bonding layer 660 that is disposed on the first region of the second wiring pattern 630. The function and material of the protective layer 126-1 may be the same as those described with reference to FIGS. 7A and 7B.

Each of the light-emitting chips 10-1 to 10-6 may be electrically connected to the first bonding layer 650 by the first wire 20-1, and may be electrically connected to the second bonding layer 660 by the second wire 20-2.

The first extension pattern 620 may be formed over both the left region and the right region with respect to the reference line 370, and the second wiring pattern 630 and the second extension pattern 640 are located opposite each other with respect to the reference line 370, thereby mitigating limitations on the length of a wire in a wire-bonding process for the light-emitting chips 10-1 to 10-6 and the bonding layer 125 and consequently improving the freedom in the arrangement of the light-emitting chips 10-1 to 10-6 in the chip-mounting region S1.

A partition wall portion 190-1 is disposed on the bonding layer 125-1.

Figure 12:
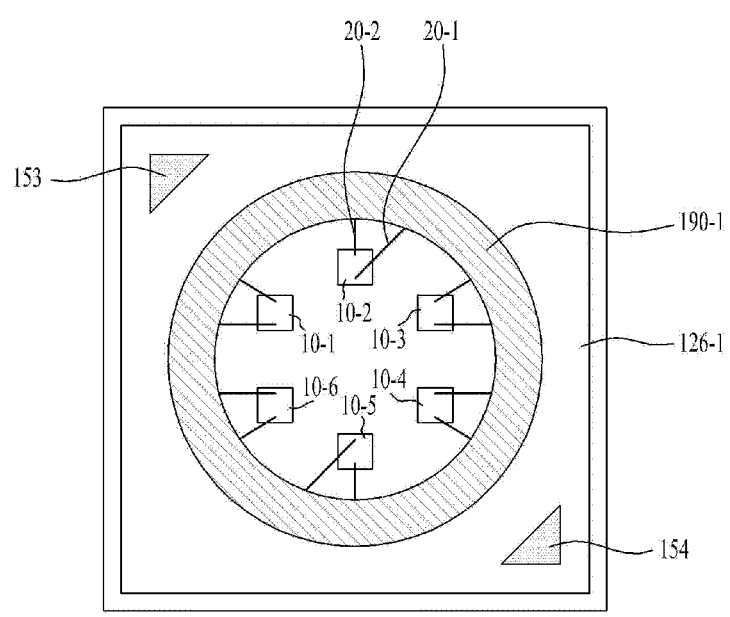
FIG. 12 illustrates a plan view of a partition wall portion disposed on the bonding layer in FIGS. 10a and 10b.

FIG. 12 illustrates a plan view of the partition wall portion disposed on the bonding layer in FIGS. 10A and 10B.

Referring to FIG. 12, the partition wall portion 190-1 may be disposed on a portion of the top surface of the first wiring pattern 610 that is adjacent to the first concave portion 601 and on a portion of the top surface of the second wiring pattern 630 that is adjacent to the first region of the second concave portion 602.

In the case of FIG. 10A, the partition wall portion 190-1 may be disposed on the first bonding layer 650 and the second bonding layer 660, and may also be disposed between the first bonding layer 650 and the second bonding layer 660.

In the case of FIG. 10B, the partition wall portion 190-1 may be disposed on the first and second bonding portions 670-1 to 670-6 and 680-1 to 680-6, the first and second extension patterns 620 and 640, and the first region of the second wiring pattern 630.

A portion of the partition wall portion 190-1 may be disposed on the portion of the top surface of the protective layer 126-1 that is adjacent to the first and second bonding layers 650 and 660, between the first concave portion 601 and the second extension pattern 640, between the second concave portion 602 and the first extension pattern 620, and between the first bonding layer 650 and the second bonding layer 660.

The shape of the partition wall portion 190-1 may be a ring shape, but is not limited thereto.

The partition wall portion 190-1 may be in contact with the bonding layer 125-1, the first and second concave portions 601 and 602 and the second adhesive layer 123. The partition wall portion 190-1 may cover the ends of the first wires 20-1 and the ends of the second wires 20-2, which are electrically connected to the bonding layer 125-1.

The material, function, shape and height of the partition wall portion 190-1 may be the same as those of the partition wall portion 190 described with reference to FIG. 8.

The molding portion 160, as described above, may fill in the interior of the partition wall portion 190-1 and the recess portion 5 of the second substrate 120.

Since the first extension pattern 624, the second concave portion 602 of the second wiring pattern 630 and the second extension pattern 640 are arranged so as to surround the chip-mounting region S1, wire bonding between the first and second wiring layers 124c and 124d and the light-emitting chips 10-1 to 10-6 may be facilitated regardless of the position in the chip-mounting region S1 at which the light-emitting chips 10-1 to 10-6 are disposed.

That is, the embodiment may mitigate limitations on the length of a wire in a wire-bonding process, and consequently may improve the freedom in the arrangement of the light-emitting chips 10-1 to 10-6 in the chip-mounting region S1.

An array of a plurality of light-emitting device packages according to the embodiment may be disposed on a substrate, and optical members such as, for example, a light guide plate, a prism sheet, and a diffuser sheet may be disposed in the optical path of the light-emitting device packages. The light-emitting device packages, the substrate, and the optical members may function as a backlight unit.

The light-emitting device package according to the embodiment may be applied to a display apparatus, an indicator apparatus, and a lighting system, and the lighting system may include, for example, a lamp, a headlamp, or a streetlight.

For example, the lighting apparatus may include a light source module, which includes a board (for example, a printed circuit board) and one or more light-emitting device packages according to the embodiment disposed on the board, a radiator configured to radiate heat of the light source module, a reflection unit configured to reflect light emitted from the light source module, and a power supply unit configured to process or convert an electrical signal from an external source so as to supply the same to the light source module.

For example, the display apparatus may include a bottom cover, a reflective plate disposed on the bottom cover, a light-emitting module configured to emit light, a light guide plate disposed in front of the reflective plate to forwardly guide light emitted from the light-emitting module, optical sheets including prism sheets disposed in front of the light guide plate, a display panel disposed in front of the optical sheets, an image signal output circuit connected to the display panel to supply an image signal to the display panel, and a color filter disposed in front of the display panel. Here, the bottom cover, the reflective plate, the light-emitting module, the light guide plate, and the optical sheets may constitute a backlight unit.

For example, the headlamp may include a light-emitting module which includes the light-emitting device packages arranged on a board, a reflector configured to reflect light, emitted from the light-emitting module, in a given direction, for example, forwards, a lens configured to forwardly refract light reflected by the reflector, and a shade configured to realize a light distribution pattern desired by a designer by blocking or reflecting some of light that has been reflected by the reflector and is directed toward the lens.

Features, structures and effects and the like described in association with the embodiments above are incorporated into at least one embodiment of the present disclosure, but are not limited to only one embodiment. Furthermore, features, structures and effects and the like exemplified in association with respective embodiments can be implemented in other embodiments by combination or modification by those skilled in the art. Therefore, contents related to such combinations and modifications should be construed as falling within the scope of the present disclosure.

INDUSTRIAL APPLICABILITY

The embodiments may be used for lighting devices and display devices.

The invention claimed is:

1. A light-emitting device package comprising:
a substrate having a chip-mounting region;
first and second wiring layers disposed on the substrate around the chip-mounting region so as to be spaced apart from each other; and
a plurality of light-emitting chips disposed on the chip-mounting region,
wherein the first wiring layer includes a first wiring pattern disposed at one region with respect to a reference line and having a first concave portion, and a first extension pattern extending from the first wiring pattern to an opposite region with respect to the reference line,
the second wiring layer includes a second wiring pattern disposed at the opposite region with respect to the reference line and having a second concave portion, and a second extension pattern extending from the second wiring pattern to the one region with respect to the reference line, wherein the first extension pattern includes a first connection portion connected to one end of the first concave portion, and a first extension portion connected to the first connection portion and having a shape of a curved line, the curved line being concave in a direction opposite the first concave portion, and
the second extension pattern includes a second connection portion connected to one end of the second concave portion, and a second extension portion connected to the second connection portion and having a shape of a curved line, the curved line being concave in a direction opposite the second concave portion, and
wherein the reference line is a straight line passing through a center of the chip-mounting region.

2. The light-emitting device package according to claim 1, wherein the second concave portion is concave in a direction opposite the first concave portion.

3. The light-emitting device package according to claim 2, wherein the first extension pattern extends from one end of an inner peripheral surface of the first concave portion, and a distal end of the first extension pattern is spaced apart from a remaining end of the inner peripheral surface of the first concave portion, and
the second extension pattern extends from one end of an inner peripheral surface of the second concave portion, and a distal end of the second extension pattern is spaced apart from a remaining end of the inner peripheral surface of the second concave portion.

4. The light-emitting device package according to claim 1, wherein the first concave portion and the second concave portion have a semi-spherical shape and the first extension pattern and the second extension pattern have a shape of a curved line.

5. The light-emitting device package according to claim 1, wherein the first connection portion is disposed between a remaining end of the second concave portion and a distal end of the second extension pattern, and the second connection portion is disposed between a remaining end of the first concave portion and a distal end of the first extension pattern.

6. The light-emitting device package according to claim 1, wherein the first connection portion and the second connection portion face each other in a direction parallel to the reference line.

7. The light-emitting device package according to claim 1, wherein the first connection portion and the first extension portion have the same width, and
the second connection portion and the second extension portion have the same width.

8. The light-emitting device package according to claim 1, wherein a first opening is formed between a remaining end of the first concave portion and a distal end of the first extension portion, and a second opening is formed between a remaining end of the second concave portion and a distal end of the second extension portion, and
the first connection portion passes through the second opening, and the second connection portion passes through the first opening.

9. The light-emitting device package according to claim 1, wherein the first wiring layer and the second wiring layer are origin-symmetric to each other about the center of the chip-mounting region.

10. The light-emitting device package according to claim 1, wherein the first extension portion is disposed along an inner peripheral surface of the second concave portion so as to be spaced a predetermined distance apart from the inner peripheral surface of the second concave portion, and
the second extension portion is disposed along an inner peripheral surface of the first concave portion so as to be spaced a predetermined distance apart from the inner peripheral surface of the first concave portion.

11. The light-emitting device package according to claim 1, wherein the substrate includes:
a first substrate; and
a second substrate including the first wiring layer and the second wiring layer and disposed on the first substrate so as to expose a portion of the first substrate corresponding to the chip-mounting region.

12. The light-emitting device package according to claim 11, further comprising:
a first bonding layer disposed on the first wiring pattern and the first extension pattern; and
a second bonding layer disposed on the second wiring pattern and the second extension pattern.

13. The light-emitting device package according to claim 12, further comprising:
a protective layer disposed on the first and second wiring layers so as to expose the first and second bonding layers.

14. The light-emitting device package according to claim 13, further comprising:
at least one first wire for connecting the first bonding layer and at least one of the light-emitting chips; and
at least one second wire for connecting the second bonding layer and at least one of the light-emitting chips.

15. A lighting device comprising:
a light source module including the light-emitting device package according to claim 1; and
a radiator for radiating heat of the light source module.

* * * * *